United States Patent [19]
Isaacs et al.

[11] 3,991,330
[45] Nov. 9, 1976

[54] ACOUSTIC SURFACE WAVE DEVICE USING SINGLE CRYSTAL OF $Tl_3VS_4$ OR $Tl_3NbS_4$

[75] Inventors: Thelma J. Isaacs; Michael R. Daniel, both of Monroeville, Pa.

[73] Assignee: Westinghouse Electric Corporation, Pittsburgh, Pa.

[22] Filed: Apr. 23, 1974

[21] Appl. No.: 463,337

[52] U.S. Cl. .............................. 310/9.5; 310/9.8; 333/30 R; 252/62.9
[51] Int. Cl.² ........................................ H01L 41/08
[58] Field of Search ................ 310/8, 8.1, 9.8, 9.7, 310/9.5, 9.6; 333/30 R; 252/62.9

Primary Examiner—Mark O. Budd
Attorney, Agent, or Firm—R. D. Fuerle

[57] ABSTRACT

An acoustic surface wave device is disclosed which comprises a crystal of $Tl_3VS_4$, $Tl_3NbS_4$, or mixtures thereof having at least one surface at least ½ cm long, a surface wave generating transducer mounted on the surface, and a surface wave receiving transducer mounted on the surface positioned to receive a surface wave generated by the surface wave generating transducer.

The device transmits surface waves at a low velocity and high coupling efficiency and can be used in a delay line, a filter, an FM discriminator, an oscillator, or other device.

11 Claims, 1 Drawing Figure

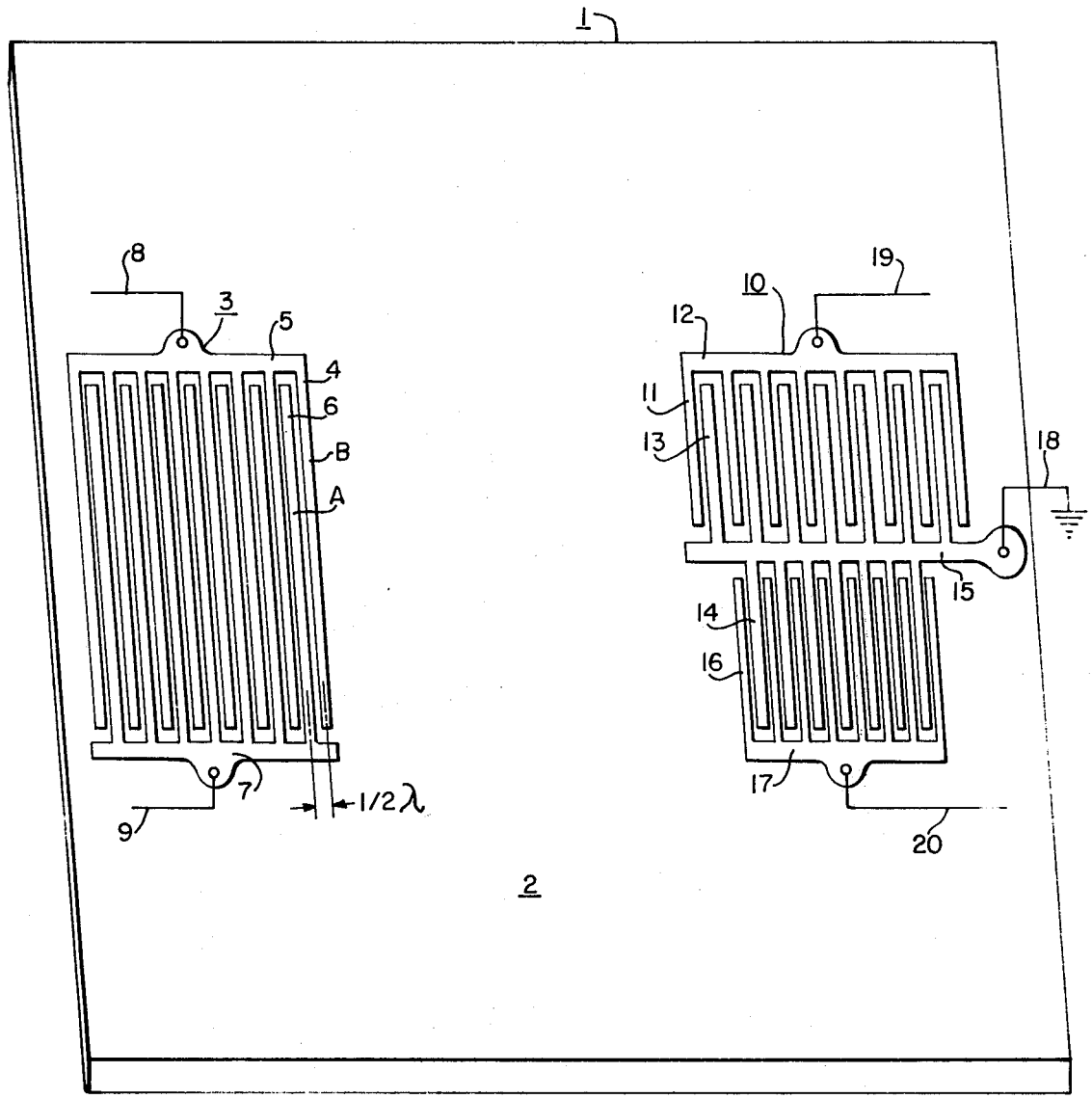

ACOUSTIC SURFACE WAVE DEVICE USING SINGLE CRYSTAL OF Tl₃VS₄ OR Tl₃NbS₄

CROSS-REFERENCE TO RELATED APPLICATION

This application is related to application Ser. No. 392,695 filed Aug. 29, 1973 by Isaacs, Gottlieb, Feichtner, and Price titled "$Tl_3VS_4$ and $Tl_3NbS_4$ Crystals And Acousto-Optical Devices."

BACKGROUND OF THE INVENTION

Acoustic surface waves travel across the surfaces of a single crystal material at a slower rate than acoustic bulk waves can travel through the crystal. For this reason, a greater delay time can be achieved in a smaller crystal by a surface wave than by a bulk wave.

For certain applications a good acoustic surface wave material should have a low acoustic velocity relative to other materials. It should also have large coupling strength, which is a measurement of the amount of energy required to generate a surface wave of a given energy.

Another property of a good acoustic surface wave material is a low optimum number of finger pairs. The optimum number of finger pairs (in the transducer) is the minimum number which can be used without the loss of energy (insertion loss) due to the generation of bulk waves in the crystal. Bulk waves would be received at the receiving transducer and would confuse the signal. Since the bandwidths of the generated and received signals are equal to the inverse of the number of finger pairs in the generating and receiving transducers, a small optimum number of finger pairs permits a wider selection of bandwidths.

Still another important property is a low temperature coefficient of delay. As the temperature of the crystal increases, the delay of the surface wave will either increase (a positive coefficient) or decrease (a negative coefficient). The delay of a surface wave in a good material should not be affected very much by temperature and therefore should have a temperature coefficient which is close to zero.

The following table gives the properties of the best-known acoustic surface wave materials:

Soviet Physics - Semiconductors, Vol. 6, No. 12, pages 2007 to 2008 described the preparation of polycrystalline ingots of $Tl_3VS_4$ from which crystals 1 × 1 × 1 mm were cleaved. No opto-acoustic properties are discussed.

SUMMARY OF THE INVENTION

We have discovered acoustic surface wave devices using crystals of $Tl_3VS_4$, $Tl_3NbS_4$, or mixtures thereof, which have some properties which are superior to devices using the best-known prior art materials. These properties make the device suitable for use as a delay line, a filter, an FM modulator, an oscillator, or other application.

DESCRIPTION OF THE INVENTION

The accompanying drawing is an isometric view of an embodiment of an acoustic surface wave device according to this invention.

In the drawing, a crystal 1 of $Tl_3VS_4$, $Tl_3NbS_4$, or mixtures thereof, is shown which has a suitable surface 2 for the propagation of surface waves. Mounted on this surface is surface wave generating transducer 3.

While any type of surface wave generating transducer may be used, an interdigitated transducer, as shown in the drawing, is preferred since it is known to perform well. The transducer is made up of fingers 4, connected by bar 5, which alternate with fingers 6, connected by bar 7. Ordinarily, all the fingers are of the same width and length although other designs may also be used. Wires 8 and 9 are connected to bars 5 and 7, respectively. An electrical signal sent through wires 8 and 9 results in the generation of an acoustic surface wave moving across the crystal. Since the wave propagates in both directions perpendicular to the fingers, there is a loss of energy (insertion loss) of 50% from this transducer even when at least the optimum number of finger pairs is used. The surface wave is preferably a Rayleigh wave because they are the most convenient to use.

The acoustic surface wave is received by surface wave receiving transducer 10, also mounted on the surface of the crystal. This transducer may also be any type of surface wave receiving transducer, although an

| Material | Orientation | Velocity 10⁵ cm/sec | Delay μsec/mm | Temperature Coefficient of Delay ppm/° C | Coupling Strength $k^2$ (%) | Optimum No. of Finger Pairs | Effective Dielectric Constant |
|---|---|---|---|---|---|---|---|
| LiNbO₃ | YZ | 3.40 | 0.29 | + 93 | 4.8 | 4.5 | 50 |
| Bi₁₂GeO₂₀ | (112),(111) | 1.72 | 0.58 | + 112 | 0.46 | 13 | 11 |
| SiO₂ | YX | 3.16 | 0.32 | − 25 | 0.18 | 21 | 4.3 |

Additional information about surface waves can be found in a January 1971 article in Vol. 9, No. 1 of Ultrasonics by John de Klerk titled "Ultrasonic Transducers 3. Surface Wave Transducers" and in a November 1972 article in Vol. 25, No. 11 Physics Today by John de Klerk titled "Elastic Surface Waves."

PRIOR ART

An article entitled "Some Ternary Thallium Chalcogenides" by C. Crevecoeur appears in the January-June 1964 volume (Volume No. 17) of Acta Crystallographica on page 757. That article describes the preparation and characteristics of the isomorphous compounds $Tl_3VS_4$, $Tl_3NbS_4$, $Tl_3TaS_4$, $Tl_3VSe_4$, $Tl_3NbSe_4$, and $Tl_3TaSe_4$. Large, single crystals were not prepared and acoustic properties are not mentioned.

An article entitled "Switching Effect In Crystalline $Tl_3VS_4$" by L. N. Antipova, B. V. Belyaev, V. A. Gor'kov, and V. P. Rombakh in the June 1973 issue of interdigitated transducer is preferred as it works very well. Transducer 10, of a different construction than transducer 3, has positive fingers 11 connected by bar 12, ground fingers 13 and 14 connected by bar 15, and negative fingers 16 connected by bar 17. Bar 15 is grounded by wire 18 and the signal is received relative to the ground through leads 19 and 20 attached to bars 12 and 17 respectively. Transducers 9 and 10 are typically made by vapor depositing a metal such as gold or aluminum onto the crystal.

DEVICES

A delay line is used in various signal processing equipment, for example, for comparing a first signal to a second signal which arrives at a later time. The delay, or transit time, may be determined by dividing the center-to-center separation of the two transducers by the velocity of the surface wave. In a simple delay line, both the surface wave generating transducer and the surface wave receiving transducer may take the form of transducer 3 in the drawing.

A filter may be used, for example, in an oscillator to maintain a signal of a predetermined frequency. The peak signal wavelength which is passed through the filter is equal to twice the distance between the centers of a finger pair, for example, fingers A and B in the drawing. The peak signal of frequency, of course, is equal to peak signal wavelength divided by the speed of the wave. For interdigitated transducers, the bandwidth of the surface wave which is generated or received is equal to the inverse of the number of finger pairs. Thus, a filter can permit only a narrow band of a predetermined frequency to pass if a large number of finger pairs is used with the finger spacing required for the desired frequency.

An FM discriminator receives a signal which varies in frequency from $f_1$ to $f_2$ about a mean frequency $f_0$. It produces a signal whose amplitude is proportional to the difference frequencies $f_0-f_1$, and $f_0-f_2$. In the drawing, the incoming signal in lines 8 and 9 enters transducers 3 and generates a surface wave in the crystal. The finger spacing of transducer 3 is set to generate a wave at a frequency $f_0$, halfway between $f_1$ and $f_2$, but the bandwidth of the wave is broad enough to generate waves at frequencies $f_1$ and $f_2$ as well. Transducer 10 is really two transducers having the same ground. Fingers 11 and 13 are spaced to receive the lower frequency $f_1$ and fingers 14 and 16 are spaced to receive the higher frequency $f_2$. For additional information on FM discriminators see U.S. Pat. No. 3,626,309.

THE CRYSTALS

The crystals of this invention are optically isotropic, but piezoelectric, and crystallographically cubic. They have the CsCl structure, I 4 3m, with two formula units per unit cell, and their diffraction aspect derived from X-ray data is I***. The length of the axes of the Tl$_3$VS$_4$ crystal is about 7.497 ± 0.004 A. Crystals having the optimum properties may not be exactly of stoichiometric composition, and crystals within about 5% of stoichiometric are contemplated within the scope of this invention. Mixtures of the two crystals, such as Tl$_3$(V$_{0.5}$, Nb$_{0.5}$)S$_4$, are also contemplated within the scope of this invention.

For a useful acoustic surface wave device, the crystal must have at least one surface suitable for surface wave propagation which is at least ½ cm long; a typical length is about 1 to about 3 cm. A surface which is suitable for acoustic surface wave propagation is one which is smooth to within one-hundredth of the acoustic wavelength. A suitable crystal should also be at least about ½ cm wide in order to provide a sufficient surface for mounting the transducers, and at least about 1 mm thick so that it is not too fragile to handle.

The following example of the preparation and testing of an acoustic surface wave device using a crystal of Tl$_3$VS$_4$ further illustrates this invention. An acoustic surface wave device using a crystal of Tl$_3$NbS$_4$ or mixtures of the two crystals can be prepared in the same manner.

EXAMPLE 13.7951g. thallium, 1.1416g. vanadium, and 2.8859g. sulfur were carefully weighed out and placed in a fused silica ampoule. The ampoule was evacuated, sealed, and heated to about 1000° C for three days with intermittent shaking. The material was cooled, broken up, placed into a crystal-growing tube, and sealed under 0.8 atmospheres of pure, dry argon. The crystal-growing tube was slowly (about 12 mm/day) lowered from a temperature zone above the crystal melting point (about 515° C ± 25° C) to temperature zone below its melting point at a temperature gradient of about 10° C/mm. The resulting crystal was 0.8 cm in diameter and 2.5 cm long and had a deep blackish purple color. It was cut to about 1 cm long by ½ cm wide by ½ cm thick and was polished to a smooth, flat surface having an (001), (110) orientation.

Gold interdigitated acoustic wave generating and receiving transducers were vapor deposited on the surface. The transducers were about ½ cm apart and each had 17 ½ finger pairs. The finger spacing was 25 microns. Wire leads were soldered to the transducers and it was tested by sending an 8 ½ MHz signal of 1 volt into the generating transducer and detecting the signal at the receiving transducer. The following properties were observed:

Acoustic Surface Wave Velocity = 0.87 × 10$^5$ cm/sec
Delay = 1.15 μsec/mm
Temperature Coefficient of Delay = −54 ppm/° C
Coupling Strength ($K^2$) = 1.39%
Optimum Number of Finger Pairs = 7.5 (calculated)
Insertion Loss at 7.5 Finger Pairs = about 6 decibels
Effective Dielectric Constant = 14

The properties of the Tl$_3$NbS$_4$ device have not been precisely determined as yet, but they are expected to be similar to those of the Tl$_3$VS$_4$ device.

What we claim is:

1. An acoustic surface wave device comprising
   1. a single crystal selected from the group consisting of Tl$_3$VS$_4$, Tl$_3$NbS$_4$, and mixtures thereof, said crystal having at least one surface at least ½ cm long suitable for the propagation of surface waves;
   2. a surface wave generating transducer mounted on said surface; and
   3. a surface wave receiving transducer mounted on said surface positioned to receive surface waves emanating from said surface wave generating transducer.

2. An acoustic surface wave device according to claim 1 wherein said crystal is Tl$_3$VS$_4$.

3. An acoustic surface wave device according to claim 2 wherein said transducers are interdigitated transducers and each has at least about 7 ½ finger pairs.

4. An acoustic surface wave device according to claim 3 wherein said surface wave receiving transducer has positive and negative finger pairs each interdigitated with ground finger pairs, and the said positive finger pairs have a wider spacing than the finger pairs of said surface wave generating transducer, and said negative finger pairs have a narrower spacing than the finger pairs of said surface wave generating transducer.

5. A method of delaying an electrical signal comprising 1. passing said signal through a surface wave generating transducer mounted on a surface of a single crystal selected from the group consisting of $Tl_3VS_4$, $Tl_3NbS_4$, and mixtures thereof, said surface being at least ½ cm long and suitable for the propagation of surface waves; and
2. receiving said signal from a surface wave receiving transducer mounted on said surface positioned to receive surface waves emanating from said surface wave generating transducer.

6. A method according to claim 5 wherein said crystal is $Tl_3VS_4$.

7. A method according to claim 6 wherein each of said transducers is an interdigitated transducer having at least about 7 ½ finger pairs.

8. An acoustic surface wave device according to claim 1 wherein said single crystal is about 1 to about 3 cm long, at least about ½ cm wide, and at least about 1 mm thick.

9. An acoustic surface wave device according to claim 1 wherein said crystal is $Tl_3NbS_4$.

10. A method according to claim 5 wherein said single crystal is about 1 to about 3 cm long, at least about ½ cm wide, and at least about 1 mm thick.

11. A method according to claim 5 wherein said crystal is $Tl_3NbS_4$.

* * * * *